| (12) | United States Patent | (10) Patent No.: | US 10,331,360 B2 |
|---|---|---|---|
| | Sundaram et al. | (45) Date of Patent: | Jun. 25, 2019 |

(54) SCALABLE BANDWIDTH NON-VOLATILE MEMORY

(71) Applicant: Intel Corporation, Santa Clara, CA (US)

(72) Inventors: Rajesh Sundaram, Folsom, CA (US); Albert Fazio, Saratoga, CA (US); Derchang Kau, Cupertino, CA (US); Shekoufeh Qawami, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/281,006

(22) Filed: Sep. 29, 2016

(65) Prior Publication Data

US 2018/0088834 A1    Mar. 29, 2018

(51) Int. Cl.
| G06F 12/00 | (2006.01) |
| G06F 3/06 | (2006.01) |
| G06F 13/16 | (2006.01) |
| G06F 12/02 | (2006.01) |
| G11C 13/00 | (2006.01) |

(52) U.S. Cl.
CPC .......... *G06F 3/0613* (2013.01); *G06F 3/0644* (2013.01); *G06F 3/0659* (2013.01); *G06F 3/0688* (2013.01); *G06F 12/0238* (2013.01); *G06F 12/0246* (2013.01); *G06F 13/16* (2013.01); *G06F 13/1657* (2013.01); *G11C 13/0004* (2013.01)

(58) Field of Classification Search
CPC .... G06F 3/0613; G06F 3/0644; G06F 3/0659; G06F 6/0688; G06F 13/1652; G06F 13/1657; G06F 12/0238; G06F 12/0246
See application file for complete search history.

(56) References Cited

U.S. PATENT DOCUMENTS

| 2013/0138868 A1 | 5/2013 | Seroff et al. |
| 2016/0019160 A1* | 1/2016 | Mohan ................ G06F 12/1009 711/208 |
| 2016/0232088 A1 | 8/2016 | Mohan et al. |

OTHER PUBLICATIONS

International search report dated Nov. 24, 2017, in PCT Application No. PCT/US2017/049502 filed Aug. 30, 2017; 11 pages.

* cited by examiner

*Primary Examiner* — Shawn X Gu
(74) *Attorney, Agent, or Firm* — Thorpe North and Western, LLP; Todd B. Alder

(57) ABSTRACT

Cross point memory architectures, devices, systems, and methods are disclosed and described, and can include a cross point memory core subsystem having increased bandwidth that is scalable. The memory core can include a plurality of independently operating partitions, each comprising a plurality of cross point memory arrays.

19 Claims, 7 Drawing Sheets

| Timing Parameter | RULE |
|---|---|
| t_Read_to_Read_Same_Partition | Time X1 (ns) |
| t_Read_to_Read_Different_Partition | Time X2 (ns) |
| t_Write_to_Write_Same_Partition | Time X3 (ns) |
| t_Write_to_Write_Different_Partition | Time X4 (ns) |
| t_Read_to_Write_Same_Partition | Time X5 (ns) |
| t_Read_to_Write_Different_Partition | Time X6 (ns) |
| t_Write_to_Read_Same_Partition | Time X7 (ns) |
| t_Write_to_Read_Different_Partition | Time X8 (ns) |

FIG. 5

SCALABLE BANDWIDTH NON-VOLATILE MEMORY

BACKGROUND

Computer devices and systems have become integral to the lives of many, and include numerous uses, from social media to intensive computational data analysis. Such devices and systems can include tablets, laptops, desktop computers, network servers, and the like. Memory subsystems play an important role in the implementation of such devices and systems, and are one of the key factors affecting performance.

Memory subsystems provide buffering and data storage to a variety of electronics devices and systems, and thus can include volatile memory structures that lose stored information when not powered (e.g., DRAM-Dynamic Random Access Memory), and non-volatile memory structures that retain stored information even when not powered (e.g. NAND). Whether volatile or non-volatile in form, because of the central role of memory in all computing processes, efforts to advance speed and efficiency of memory operation are continuously ongoing.

BRIEF DESCRIPTION OF THE DRAWINGS

Features and advantages of invention embodiments will be apparent from the detailed description which follows, taken in conjunction with the accompanying drawings, which together illustrate, by way of example, invention features; and, wherein:

FIG. 5 shows a general example of command and timing in accordance with an example embodiment;

Figure 1:
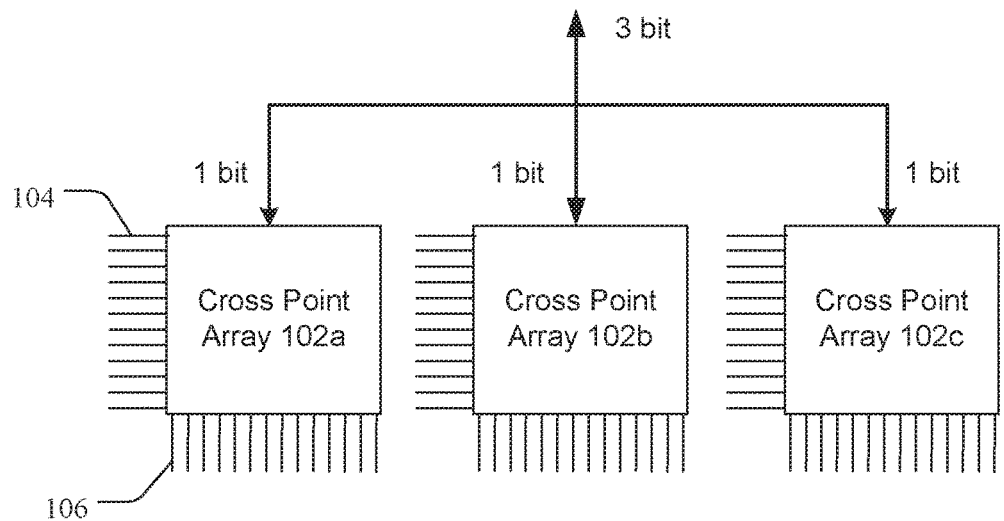
FIG. 1 shows a plurality of non-volatile cross point memory arrays in accordance with an example embodiment.

Reference will now be made to the exemplary embodiments illustrated, and specific language will be used herein to describe the same. It will nevertheless be understood that no limitation on invention scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Reference throughout this specification to "an example" means that a particular feature, structure, or characteristic described in connection with the example is included in at least one embodiment of the present invention. Thus, appearances of the phrases "in an example" or "an embodiment" in various places throughout this specification are not necessarily all referring to the same embodiment.

As used herein, a plurality of items, structural elements, compositional elements, and/or materials can be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention can be referred to herein along with alternatives for the various components thereof. It is understood that such embodiments, examples, and alternatives are not to be construed as de facto equivalents of one another, but are to be considered as separate and autonomous representations under the present disclosure.

Furthermore, the described features, structures, or characteristics can be combined in any suitable manner in one or more embodiments. In the following description, numerous specific details are provided, such as examples of layouts, distances, network examples, etc., to provide a thorough understanding of invention embodiments. One skilled in the relevant art will recognize, however, that the technology can be practiced without one or more of the specific details, or with other methods, components, layouts, etc. In other instances, well-known structures, materials, or operations may not be shown or described in detail to avoid obscuring aspects of the disclosure.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this specification, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

As used herein, comparative terms such as "increased," "decreased," "better," "worse," "higher," "lower," "enhanced," and the like refer to a property of a device, component, or activity that is measurably different from other devices, components, or activities in a surrounding or adjacent area, in a single device or in multiple comparable devices, in a group or class, in multiple groups or classes, or as compared to the known state of the art. For example, a data region that has an "increased" risk of corruption can refer to a region of a memory device which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

Numerical amounts and data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Example Embodiments

An initial overview of technology embodiments is provided below and then specific technology embodiments are described in further detail later. This initial summary is intended to aid readers in understanding the technology embodiments more quickly, but is not intended to identify key or essential technological features nor is it intended to limit the scope of the claimed subject matter. Unless defined otherwise, all technical and scientific terms used herein have the same meaning as commonly understood by one of ordinary skill in the art to which this disclosure belongs.

In order to persistently store data in an array of non-volatile memory cells, some form of addressing and accessing the array is necessary. There are various memory architectures that accomplish this, two examples of which include floating-gate transistor-based and cross point-based architectures. Floating-gate transistor-based architectures are used extensively in NAND flash memory, and generally utilize three or four transistor nodes to read or write. Upon receiving a memory access command directed to only a portion of a NAND flash memory array, the entire array of memory cells must be read out or written to in order to perform the memory access. In other words, floating-gate transistor-based architectures access memory at the memory array level, which is "parallel" memory access by nature. Cross point-based architectures that lack transistors at each memory cell, on the other hand, can generally be described as an array of bit lines and an array of word lines oriented perpendicular to one another, with an array of memory cells aligned therebetween at the points where the lines cross one another. Each memory cell in a cross point array is uniquely addressed by two lines, a single word line and a single bit line. Thus, by activating a bit line and a word line, a single memory cell is accessed at the crossing point of these two lines in the memory array. In contrast to NAND flash memory, cross point memory arrays access memory at the memory cell-level, which is "serial" memory access by nature.

The presently disclosed technology is directed to cross point memory cell architectures having increased bandwidth that can be scalable. While access to a single memory cell in a cross point memory array is a serial process, parallel memory access can be achieved by simultaneously accessing multiple cross point memory arrays. Such "parallelism" functions to significantly increase the bandwidth of cross point memory architectures. For example, FIG. 1 shows a single cross point memory array 102a, having a plurality of bit lines 104 and a plurality of word lines 106, where each memory cell (not shown) within the array is uniquely addressed by a single bit line and a single word line combination. This architecture allows only one memory cell in the array to be accessed at a time, or in other words, a single cross point array has a 1-bit bandwidth (assuming a binary-state memory cell). FIG. 1 shows a total of three single cross point arrays (102a-c), each of which can operate at a 1-bit bandwidth. However, the combined output of these three cross point arrays can be additive, resulting in a 3-bit bandwidth. By simultaneously accessing multiple single cross point arrays 102a-c, the serial cross point memory architecture can function in a parallel manner.

Figure 2:
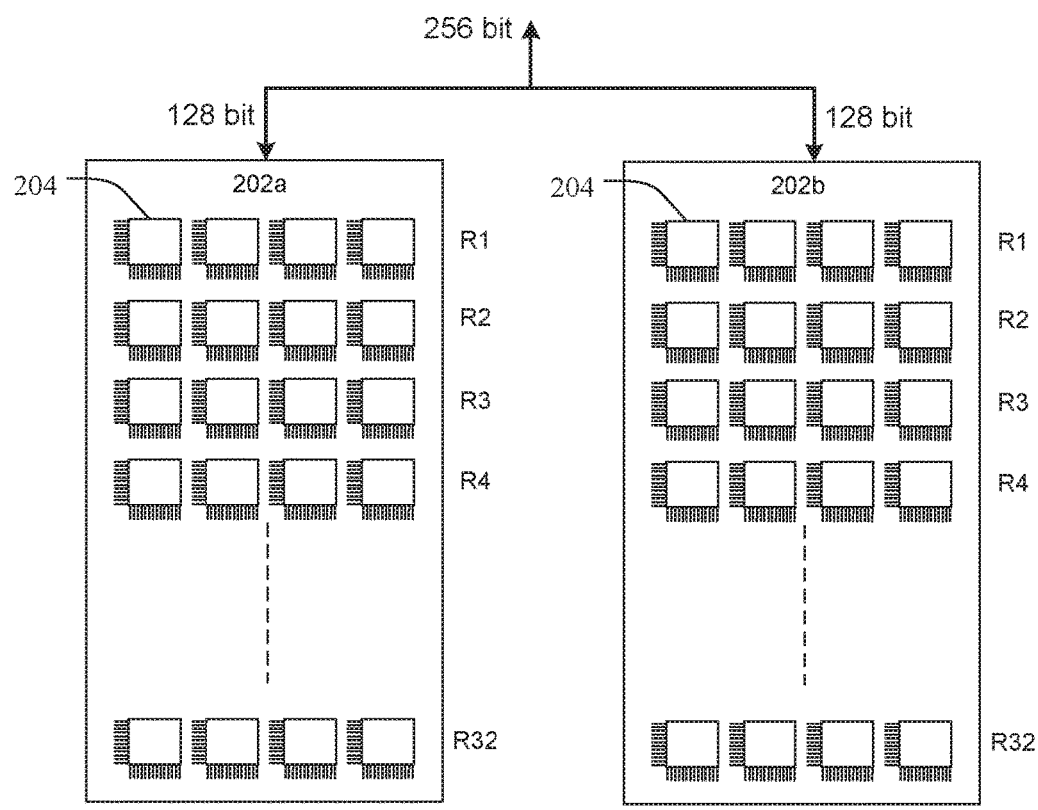
FIG. 2 shows a plurality of memory partitions in accordance with an example embodiment.

Bandwidth can be further increased, as shown in FIG. 2, where a memory partition 202a is shown having a plurality of cross point memory arrays 204. In this non-limiting example, the partition 202a includes four cross point memory arrays 204 in 32 rows (R1-R32), for a total of 128 cross point memory arrays 204. With one memory cell access per cycle, the bandwidth of partition 202a is 128 bits. For each partition added to the system, the bandwidth is increased by another 128 bits. FIG. 2 shows a second partition 202b, for example, which adds 128 bits of bandwidth for a total of 256 bits. It is noted that the number of cross point memory arrays, the number of partitions, and the like, are merely exemplary, and any number of such components can be included in a given design. Additionally, in some examples each partition can include the same number of cross point arrays, while in other examples different partitions can have different numbers of cross point arrays.

Such cross point memory architectures combine the features of volatile memory (e.g., bit addressable, etc.) and the persistence of non-volatile memory storage into a single memory architecture that is capable of functioning as cache memory, system memory, storage memory, or the like. This memory architecture can be highly advantageous, as it provides scalable speed and performance to nonvolatile memory subsystems, as well as simultaneous bit-level reading and writing that reduce memory wear. Additionally, such cross point memory architectures do not require transistors at each memory cell to function, thus potentially lowering manufacturing costs and power consumption.

Figure 3:
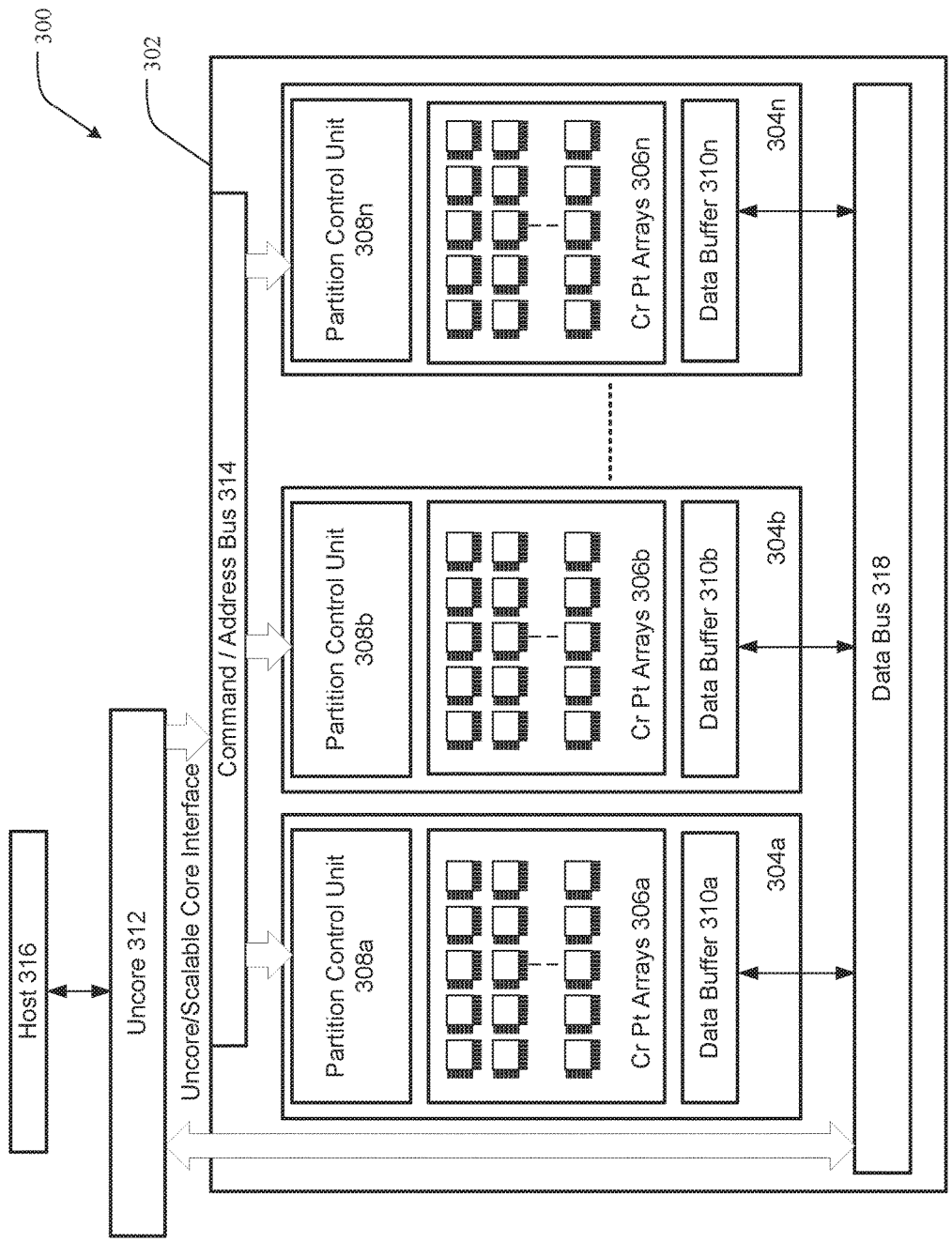
FIG. 3 shows a schematic view of a cross point memory subsystem in accordance with an example embodiment.

As one example, FIG. 3 illustrates a memory subsystem 300, having a memory core 302 that further includes a plurality of memory partitions 304a-n. Each memory partition (304a for example) includes a plurality of cross point memory arrays 306a operationally coordinated to provide the memory partition 304a with a given bandwidth according to the number of cross point memory arrays in each partition. A partition control unit 308a is interfaced with the cross point memory arrays 306a, which provides local command/address and data operation control to the memory partition 304a. The memory partition 304a further includes a data buffer 310a to buffer data to and from the memory partition 304a. A memory partition is an independently operable unit of cross point memory arrays. Thus, a given memory partition can receive a memory access command, and can perform the memory access independently of other memory partitions. A partition control unit and/or memory core can also include various other elements useful for accessing memory, which are known in the art. Non-limiting examples include sense amplifiers, sequencers, memory drivers, and the like.

The memory core 302 is scalable, and as such can suit a given computational need, such as power consumption, computational performance, size, heat, cost, and the like. For a high performance computing system, for example, increasing the number of memory partitions 304a-n in the memory core 302 increases the bandwidth of the memory subsystem. For systems having low computational expectations, the memory core can have fewer memory partitions and thus a lower bandwidth. Such a memory core may consume less power, generate less heat, reduce manufacturing cost, and the like. In another example, a memory core can maximize performance within a given power constraint, such as may be required by a systems manufacturer.

In addition to scaling via the number of memory partitions 304a-n, the cross point memory arrays 306a-n in each memory partition provide additional scaling variability to the memory core 302. Due to the relationship between bandwidth and the number of cross point arrays in the partition, scaling can be further achieved by varying the number of cross point memory arrays in a given partition. For example, a memory partition (304a, for example) having 256 arrays in the cross point memory arrays 306a portion of the partition has twice the bandwidth of a partition having 128 cross point memory arrays. Increasing the size or capacity (i.e., the number of memory cells) of each cross point array will increase the storage capacity of the memory arrays, but will not increase bandwidth of a partition because, regardless of capacity, a cross point array performs memory access one memory cell at a time. Thus, through the number of cross point memory array 306a portion, scalability is provided to each partition. Such can be utilized to provide scalability for a particular system use, or to allow for scalability based on future changes in memory technology, such as a reduction in the physical sizes of cross point memory arrays, or the increase in density of such arrays, to name a few. As such, the memory core can be scaled to a great degree through variability in the number of partitions, as well as the number of the cross point arrays in each partition.

Returning to FIG. 3, a memory subsystem can further include an uncore 312 interfaced and in communication with the memory core 302 through a command/address bus 314. The uncore 312 is communicatively coupled to a host 316, such as, without limitation, a memory controller, processor, or the like. The uncore 312 is also interfaced and in communication with the memory core 302 through a data bus 318. Thus, on the memory core 302 side, the uncore 312 drives the command address bus 314 and the data bus 318, while on the host 316 side, the uncore 312 interfaces and communicates with the system. The uncore 312 is also referred to as a command/address interpretation unit because it functions as an interpreter or translator of memory access commands between the host 316 and the memory core 302. Using command and timing rules, the uncore 312 receives memory access commands from the host 316, and schedules these commands across the memory core 302 to appropriate memory partitions 304a-n, which can be in terms of address locations and/or proper memory access timing. Additionally, in some examples, an uncore can interface with multiple memory cores, and vice versa.

The role of the uncore can vary widely depending on the design and the intended use of the system. At a basic level, an uncore can serve as an interface between a host memory controller and a memory core that can differ in terms of timing, expected latencies, expected memory addressing, and/or the like. The uncore can thus translate such variations between disparate systems/subsystems to thus facilitate effective communication therebetween. At a more advanced level, an uncore can include varying degrees of functionality of the host memory controller, including interfacing with a central processing unit (CPU) as a host memory controller. In such cases, the uncore can include any or all circuitry elements of a host memory controller, depending on the system architecture and the level of integration with the CPU. As such, the architecture of the uncore can vary depending upon the nature of the uncore's role in a system. In one example, the uncore can implemented as, or integrated with, an Input/Output (I/O) controller such as a Southbridge, a Platform Controller Hub (PCH), or the like, and thus interface with the memory core implemented as storage memory, such as a solid state drive (SSD), removable storage, or any other storage medium based on cross point memory architecture. In another example, the uncore can be implemented as, or integrated with, a system memory controller, such as a Northbridge, integrated controller, or the like. In such cases, the system memory controller can be coupled to the CPU via a front-side bus, integrated on-chip with the CPU, or the like, and can interface with the memory core implemented as non-volatile system memory. In another example, the uncore can be implemented as, or integrated with, a cache controller interfaced between the CPU and the memory core implemented as cache. In a further example, the uncore can be implemented on a memory device, such as an SSD, removable storage, or the like, and thus can interface between the memory core implemented as non-volatile memory and an I/O controller of a computing system. Through such varying implementations, the uncore can include any component, circuit, buffer, electronic element, and the like, that is known in a memory controller design. Some non-limiting examples can include a data block, a command interface, a data bus, a processor, core memory controller circuitry, a buffer, a lookup table, or the like, including combinations thereof.

Figure 4:
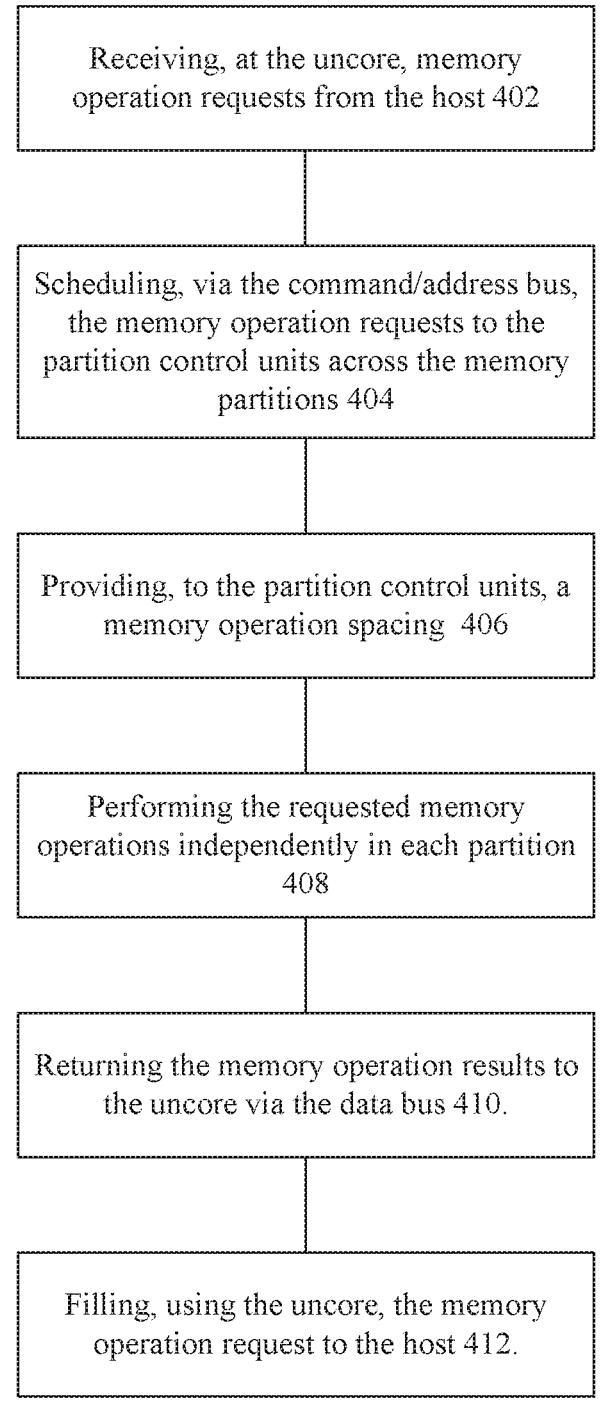
FIG. 4 shows a method of accessing a cross point memory in accordance with an example embodiment.

In one example implementation, as is shown in FIGS. 3 and 4, 402 the uncore 312 receives memory access commands from the host 316. The host 316 can be any circuit, processor, memory controller, subsystem, or the like, involved in the processing, buffering, storage, and/or retrieval of data from the memory core 302, and the interface therebetween can vary depending on the physical nature of the host. The uncore 312 "stages" or 404 schedules, via the command/address bus 314, the memory access commands to the partition control units 308a-n across the memory partitions 304a-n, and 406 provides, to the partition control units 308a-n, memory access type-dependent spacing based on command and timing rules outlining the spacing for different memory access types, either within a memory partition or across one or more memory partitions. Once scheduled, 408 the memory access commands are carried out independently in each partition. Data retrieved from or sent to the cross point memory arrays 306a-n can be buffered in the data buffers 310a-n, and 410 returned to the uncore 312 through the data bus 318. The uncore 312, 412 then fills the memory access command to the host 316.

In another example, the method can include determining a memory partition on which to perform the memory access command and a memory access spacing from the command and timing rules for the memory access command. See FIG. 5 and the associated discussion below for a further description of spacing relating to the command and timing rules. When scheduling the memory access command on a given memory partition, the uncore can provide the proper memory access spacing that is sufficient to allow one memory access to complete before any subsequent memory access is initiated on that same partition. In some examples, the command and timing rules can be resident at the host, and thus would be sent to the uncore. In other examples, the command and timing rules can be resident at each partition control unit, where the uncore provides the type of command, and the partition control units determine the proper memory access timing from the rules.

The staging decision of which memory partition to schedule which memory access command into can be made, in some examples, by the uncore. In the case of read access commands, for example, the uncore can send the memory access command to the partition control unit(s) associated with the memory partition containing the requested data. In the case of write access commands, the uncore can send the memory access command to any available memory partition, although in some examples a decision algorithm may prioritize some partitions over others. For example, memory access commands can be prioritized to memory partitions based on scheduled queue sizes, amount of empty storage space, categorization by data type, and the like. In other examples, the sorting decision can be made by the host.

As has been described, each memory partition 304a-n includes a plurality of cross point memory arrays 306a-n. The plurality of cross point memory arrays can include any number of cross point memory arrays, which is not seen as limiting to the present scope. As shown in FIG. 2, for example, a partition 202a includes 128 cross point memory arrays 204. In other examples, a partition can include 64 or more cross point memory arrays. As described above, a memory partition is a scalable part of the scalable memory core, and as such, it is intended that the number of cross point memory arrays in a memory partition can increase as technology changes in future generations of cross point memory. In such cases, memory partitions having 16, 32, 64, 128, 256, 512, 1024, or more cross point memory arrays can be readily incorporated into the present scalable memory core architecture. Furthermore, each cross point memory array can include any number of memory cells. Non-limiting examples can include 6, 16, 32, 64, 128, 256, 512, 1024, 2048, 4064, or more memory cells per cross point array, including intervening integers thereof.

Additionally, the cross point memory arrays can include any type of memory capable of operation in such an addressing array. In one example, the memory can be a non-volatile memory (NVM) such as, without limitation, three-dimensional (3D) cross point memory, phase change memory (PCM), resistive memory, nanowire memory, ferro-electric transistor random access memory (FeTRAM), magnetoresistive random access memory (MRAM) memory that incorporates memristor technology, spin transfer torque (STT)-MRAM, write in place non-volatile MRAM (NVMRAM), and the like.

In one example, a cross point memory array can include PCM, such as 3D cross point memory. Such memory has a number of attributes that make it highly desirable as a memory architecture for use in many current and future computing devices and systems. For example, 3D cross point memory is very fast, up to 1000 times faster than traditional storage memory, and is at least 10 times as dense as DRAM memory. One reason for the faster speeds is that 3D cross point memory accesses data at a much smaller granularity compared to block-based memory such as NAND. This, along with the non-volatility of the memory, can eliminate the traditional distinction between system memory and storage memory, thus allowing increased computation performance as well as even further memory integration with processing units, such a system-on-a-chip (SoC) technologies.

A PCM cell typically includes a memory element and a selector element. The memory element can be a chalcogenide material having at least two relatively stable states or phases, where such phase states have a large electrical resistance disparity between the two. An amorphous state tends to have a high electrical resistance, while a crystalline state tends to have a lower electrical resistance. Such material properties can be manipulated and used as the basis for a non-volatile memory storage medium. For example, a phase change material in the lower-resistance crystalline state can represent a first binary state, while a phase change material in the higher-resistance amorphous state can represent a second binary state. A binary storage device can thus be realized by inducing the material into either state to correspond with the information or data being stored, and then retrieved by reading the electrical resistances across the material to determine the resistive states of each memory bit. As a simplified example, the material can be heated and cooled in a manner that causes the material to solidify into either the crystalline state or the amorphous state. Furthermore, it may be possible to solidify the material into one of a multitude of other electrically resistive states along the spectrum between fully amorphous and fully crystalline, thus potentially providing a mechanism for the storage of multiple memory states in a single bit. Due to the relative stability of PCM materials, the programmed state is retained independent of an applied voltage. As such, information stored as a binary representation of phase states in a device utilizing such materials is retained when powered off. The selector element is used to isolate the memory element from transient currents that may negatively affect the stability of the memory cell. The selector can be a chalcogenide material, either the same as or different from the material formulation of the memory element.

The use of phase change materials in memory cells is made possible by a phenomenon known as threshold shifting. A typical phase change material in an amorphous state has such a high resistance that extremely high voltages would be required to deliver sufficient current to heat the material above the crystallization temperature. When a voltage above a threshold voltage (Vt) is applied to such an amorphous material, however, the electrical resistance is greatly decreased. The amorphous material is now electrically conductive due to this shift in Vt, and thus is rapidly heated and melted by the sudden current flow. Thus, the Vt represents a threshold at which a phase change material experiences a switch in electrical conductivity from a high resistance to a low resistance state. If the current is abruptly switched off after melting, the material will return to the amorphous state, and the Vt will recover slowly over time toward the pre-threshold shift value. If the material is heated to a temperature between the crystallization temperature (or glass transition temperature) and the melting point temperature for that material, and then maintained at the temperature (or within this range) for a sufficient time, the phase change material will crystallize and subsequently cool in a conductive state.

In such a memory architecture, a plurality of PCM cells are positioned at the crossing points of the word and bit lines of the cross point array, and thus each PCM cell is uniquely addressed by a single word line and a single bit line combination. Thus, a single PCM cell in the array is selected for reading or writing by applying a voltage across the PCM cell via the contacting word and bit lines.

As has been described herein, a set of command and timing rules is used in scheduling memory access commands, and such instructions are communicated to the memory partitions in order to ensure proper data spacing. In a traditional memory architecture such as double data rate synchronous dynamic random-access memory (DDR SDRAM) or NAND flash, the latency of a memory access is consistent because reads or writes are made to the accessed memory cells simultaneously, and then the entire memory array is read out or written to in order to fulfill the memory access command. For example, the latency is essentially the same for a memory write access involving just a few memory cells and for memory write access involving all memory cells in the memory array because, regardless of the number of memory cells altered, the entire memory array will be written to in each case.

Memory access latencies in cross point memory arrays, on the other hand, can vary as a function of whether the memory access is a read or a write, the number of memory cells or the number of memory arrays involved in the memory access, and the like. For example, the latency for a write access for a few memory cells can be very different compared to a write access for a large number of memory cells because, while the memory arrays of a given partition can be written to simultaneously, each memory cell in a given memory array are written to sequentially, and thus need to be queued. When the uncore schedules a memory access to a partition, the latency of the memory access is longer than the latency of the uncore due to the bitwise access of data to or from the cross point memory arrays of the memory partition. The uncore can function to normalize latency differences between the host or host system and the memory core, as well as between memory accesses having different latencies. Due to the fact that each partition can be read and written to by the uncore independently of one another, and due to the fact that the read and write latencies to the memory core are variable, an appropriate spacing or delay is provided with the memory access instructions via the command and timing rules to ensure that a previous memory access is completed by the memory core prior to the initiation of a subsequent memory access. Furthermore, as write latency is longer than read latency, the memory access spacing is dependent on access-type as well.

For example, in executing sequential memory access commands on a memory partition, assume that the first memory access is a read access that requires 100 ns to complete, and the second memory access is a write access that requires 400 ns to complete. In order to ensure the completion of the first memory access prior to the initiation of the second memory access, the uncore provides, via the command and timing rules, a proper spacing (or delay) for the memory accesses. In this case, the second command would be delayed until at least 100 ns after the initiation of the first memory access to allow the data buffer to clear. For the case of a first write access followed by a second read access to the same partition, the second read command would be delayed by at least 400 ns to allow the first write access to complete. In one example, the memory access commands can be queued or scheduled in a buffer at the uncore with the appropriate timings and partition pointers for the queued memory access commands. In another example, the memory access commands can be queued or scheduled in a buffer at each partition control unit, along with the command and timing rules that establish the various delays between memory access commands.

One general example of command and timing rules is shown in FIG. 5, which takes into account the differences in read and write latencies. In addition, the memory access spacing can differ, depending on the nature of the previous and/or subsequent memory access. For example, one set of timing parameters can include situations where sequential memory access commands are scheduled to the same partition. In such cases, the timing parameter includes a memory access spacing that is at least sufficient to allow the first memory access to complete prior to initiating the second memory access to ensure that the data from the first memory access has cleared the data buffer (see 310*a-n*, FIG. 3). This spacing is different for reads vs. write access commands due to the latency differences. A different set of timing parameters applies to situations where sequential memory access commands are scheduled to different partitions. In such cases, a memory access command can be scheduled without taking into account the prior memory access, because that memory access occurred in a different memory partition. In some examples, the timing parameters for cases where the subsequent memory access command is sent to a different partition can take into account the last memory access to have occurred on that partition.

The case of reading or writing to the same partition can be described as how quickly can a partition become available once a memory access is initiated on that partition, taking into account that the read and write latencies are different. The case of reading or writing to a different partition can be described as how quickly can the uncore initiate a memory access to the next partition, taking into account the different read and write latencies. FIG. 5 shows examples of initiating sequential read access commands on the same partition (t_Read_to_Read_Same_Partition), sequential reads to different partitions (t_Read_to_Read_Different_Partition), a sequential read and write to different partitions (t_Read_to_Write_Different_Partition), and so on. The Time X1, Time X2, . . . rules shown in FIG. 5 represent the memory access spacing for each timing parameter. In some cases, these memory access commands can be calculated or empirically determined, for example, by a system designer and stored in NVM of the uncore. Thus, the actual spacing times can be readily calculated or empirically measured by those having skill in the art, and would depend on the specifics of the system design used. Thus, for example, a first timing rule of "Time X1 (ns)" refers to a read-to-read memory access spacing for a read access followed by a subsequent read access to the same partition. A second timing rule of "Time X2 (ns)" refers to a read-to-read memory access spacing for a read access to one partition followed by a read access to a different partition. A third timing rule of "Time X3 (ns)" refers to a write-to-write memory access spacing for a write access followed by a subsequent write access to the same partition. A fourth timing rule of "Time X4 (ns)" refers to a write-to-write memory access spacing for a write access to one partition followed by a write access to a different partition. A fifth timing rule of "Time X5 (ns)" refers to a read-to-write memory access spacing for a read access followed by a subsequent write access to the same partition. A sixth timing rule of "Time X6 (ns)" refers to a read-to-write memory access spacing for a read access to one partition followed by a write access to a different partition. A seventh timing rule of "Time X7 (ns)" refers to a write-to-read memory access spacing for a write access followed by a subsequent read access to the same partition. An eighth timing rule of "Time X8 (ns)" refers to a write-to-read memory access spacing for a write access to one partition followed by a read access to a different partition.

The memory core/uncore technology can be utilized in various systems, subsystems, and the like. Because the architecture of the cross point memory arrays can be seamlessly hidden from the system behind the uncore and the command and timing rules, the cross point memory core can be implemented in a modular manner as nearly any form of memory, non-limiting examples of which include memory storage, main system memory, disk buffer memory, page cache memory, central processing unit (CPU) cache memory, database cache memory, system on a chip (SoC) memory, and the like.

Figure 6:
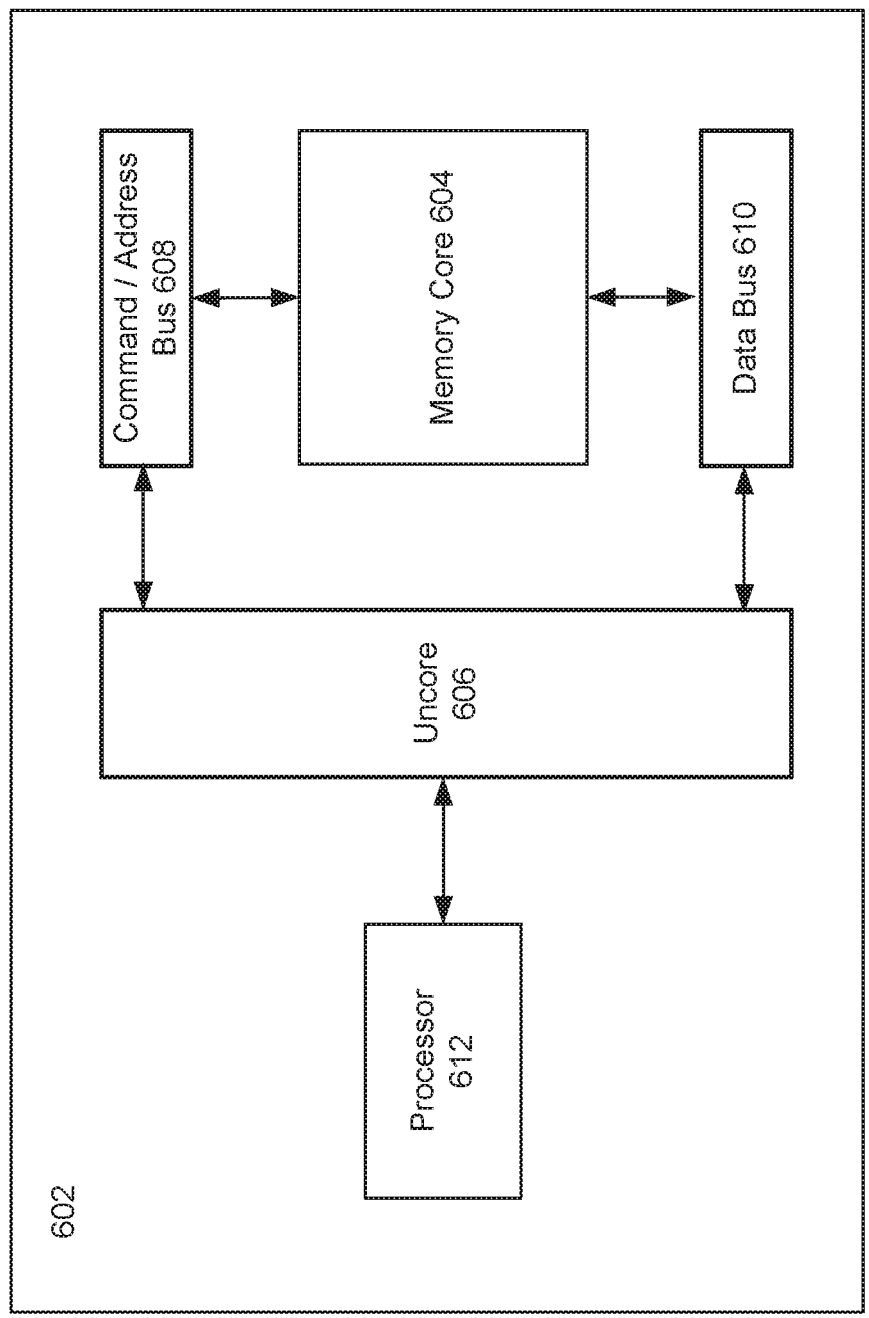
FIG. 6 shows a schematic view of a monolithic computational system in accordance with an example embodiment.

Additionally, in some examples the cross point memory core can be implemented in monolithic architectures, such as SoC, CPU cache, and the like. In one example, as is shown in FIG. 6, a monolithic design is provided having a semiconductor substrate 602, upon which the system is built. Semiconductor substrates are well known in the art, and any known semiconductor substrate material can be used. In one non-limiting example, the substrate can be silicon, such as a mono-silicon, epi-silicon, or the like. Such a system can generally include a memory core 604 and an uncore 606 in communication with the memory core. The memory core 604 includes a plurality of memory partitions (not shown), where each memory partition further includes a partition control unit, a plurality of cross point arrays, and a data buffer, as has been described herein. The uncore 606 is interfaced with the memory core 604 through a command/address bus 608 to the partition control units of the memory partitions, and through a data bus 610 to the data buffers of the memory partitions. The system further includes a processor 612, which is communicatively coupled to the uncore. The process or 612 can be any type of processor usable in a monolithic architecture. In one example, the monolithic system is an SoC system, and the processor 612 can be one or more of any processor usable in such an SoC design. Non-limiting examples of such can include microcontrollers, microprocessors, digital signal processors, multi-core processors, and the like. In another example, the monolithic system is a CPU system, and the memory core 604 is CPU cache. In this case, the processor 612 can be one or more of any processor usable as a CPU, including single core and multi-core processors.

Figure 7:
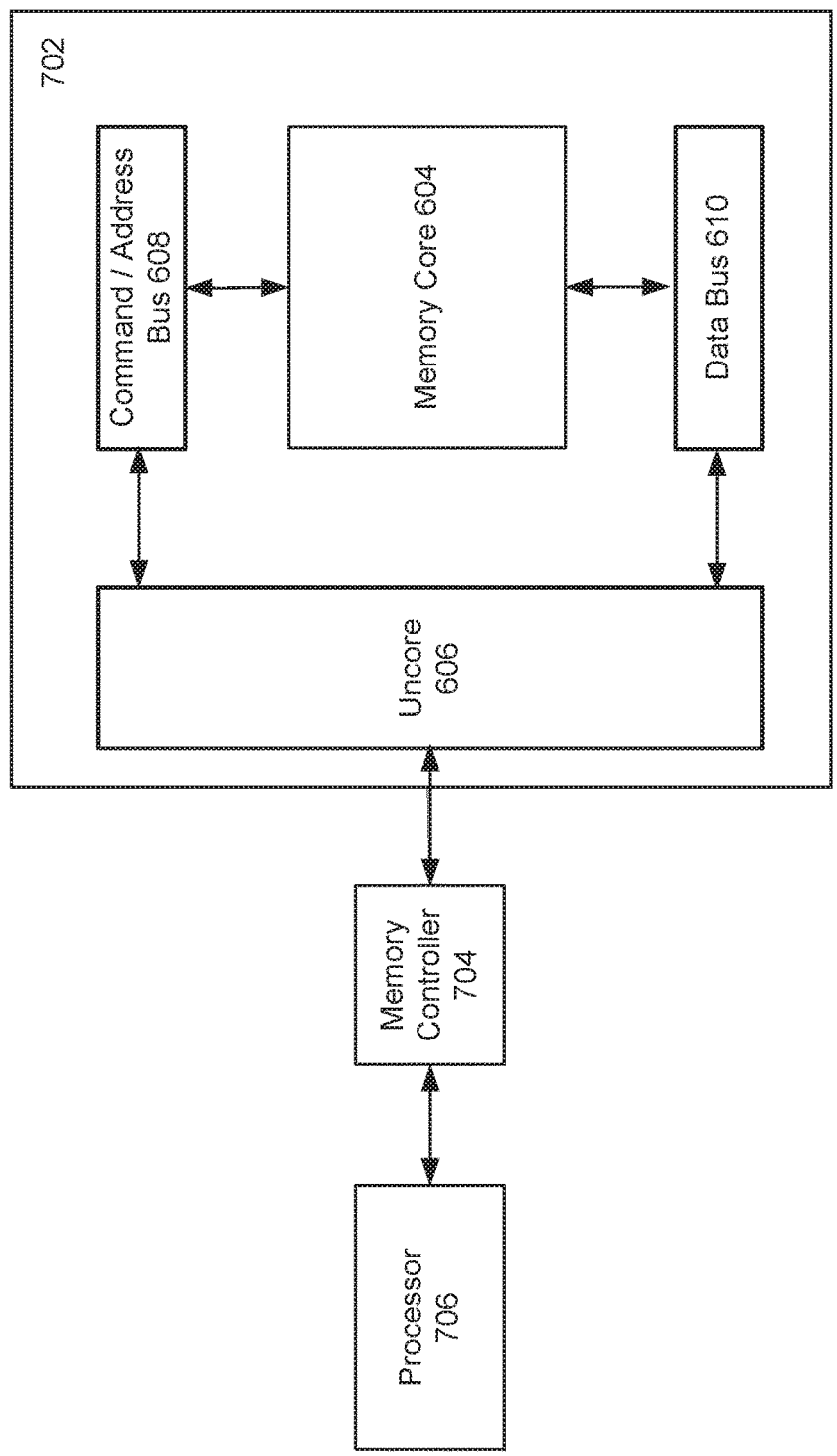
FIG. 7 shows a schematic view of a computational system in accordance with an example embodiment.

In another example, as is shown in FIG. 7, the memory core 604, uncore 606, command/address bus 608, and data bus 610, are provided as described from FIG. 6 built on a monolithic substrate 702. The uncore 606 is communicatively coupled to a memory controller 704, which is in turn communicatively coupled to a processor 706. Depending on the system implementation, the memory controller 704 can be any standard memory controller, which are well known in the art. The processor can be one or more processors, single or multi-core, as described herein or as known in the art. Thus, the uncore 606 receives memory access commands from the processor 706 via the memory controller 704. The memory access command is processed by the memory core 604 according to the command and timing rules, and the uncore 606 fulfils the memory access command to the memory controller 704. In one example, such a design can be utilized as main system memory. In such cases, the memory controller 704 can be separate and distinct from the processor 706, or the memory controller 704 can be integrated with the processor 706 as an integrated controller. In an alternative example, the memory core 604 can be a data buffer or storage memory in a memory storage device. In such cases, a second memory controller (not shown) can be communicatively coupled between the uncore 606 and the memory controller 704.

Figure 8:
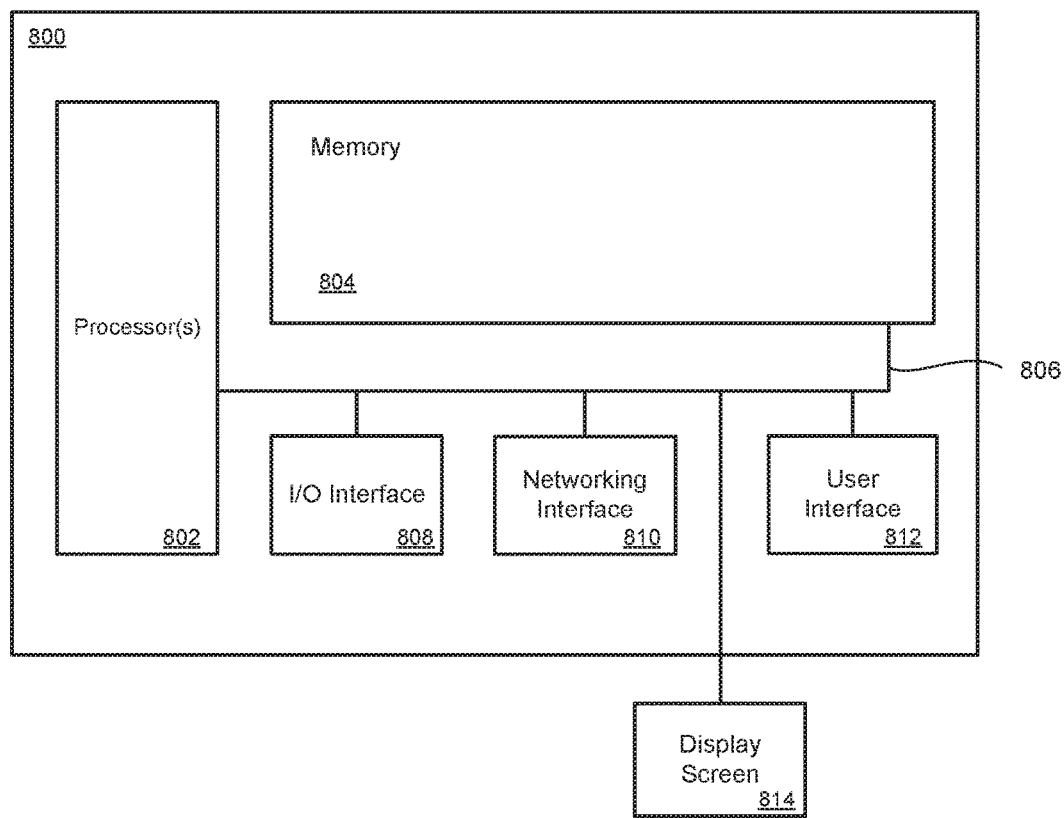
FIG. 8 shows a schematic view of a general computing system in accordance with an example embodiment.

FIG. 8 illustrates a general computing system 800 that can be employed in various examples of the present technology. The computing system 800 can include one or more processors 802 in communication with a memory 804. In one example, the memory 804 can be the uncore/cross point memory core subsystem according to the presently disclosed technology. In other examples, the uncore/cross point memory core subsystem can be a cache memory to the one or more processors 802, or the memory of an internal or external storage device. The memory 804 can include any device, combination of devices, circuitry, and the like that is capable of storing, accessing, organizing and/or retrieving data. Non-limiting examples include SANs (Storage Area Network), cloud storage networks, volatile or non-volatile RAM, phase change memory, optical media, hard-drive type media, and the like, including combinations thereof. The preceding examples can be traditional memory storage in some examples, and uncore/cross point memory core subsystems in other examples.

The computing system 800 additionally includes a local communication interface 806 for connectivity between the various components of the system. For example, the local communication interface 806 can be a local data bus and/or any related address or control busses.

The computing system 800 can also include an I/O (input/output) interface 808 for controlling various I/O functions of the system, as well as for I/O connectivity to devices outside of the computing system 800. A network interface 810 can also be included for network connectivity. The network interface 810 can control network communications both within the system and outside of the system. The network interface can include a wired interface, a wireless interface, a Bluetooth interface, optical interface, and the like, including appropriate combinations thereof. Furthermore, the computing system 800 can additionally include a user interface 812, a display device 814, as well as various other components that would be beneficial for such a system.

The processor 802 can be a single or multiple processors having single or multiple cores, and the memory 804 can be a single or multiple memories. The local communication interface 806 can be used as a pathway to facilitate communication between any of a single processor, multiple processors, a single memory, multiple memories, the various interfaces, and the like, in any useful combination.

Various techniques, or certain aspects or portions thereof, can take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device can include a processor, a storage medium readable by the processor (including volatile and non-volatile memory and/or storage elements), at least one input device, and at least one output device. The volatile and non-volatile memory and/or storage elements can be a RAM, EPROM, flash drive, cross point memory, optical drive, magnetic hard drive, solid state drive, or any other medium for storing electronic data. The node and wireless device can also include a transceiver module, a counter module, a processing module, and/or a clock module or timer module. One or more programs that can implement or utilize the various techniques described herein can use an application programming interface (API), reusable controls, and the like. Such programs can be implemented in a high level procedural or object oriented programming language to communicate with a computer system. However, the program(s) can be implemented in assembly or machine language, if desired. In any case, the language can be a compiled or interpreted language, and combined with hardware implementations. Exemplary systems or devices can include without limitation, laptop computers, tablet computers, desktop computers, smart phones, computer terminals and servers, storage databases, and other electronics which utilize circuitry and programmable memory, such as household appliances, smart televisions, digital video disc (DVD) players, heating, ventilating, and air conditioning (HVAC) controllers, light switches, and the like.

Examples

The following examples pertain to specific invention embodiments and point out specific features, elements, or steps that can be used or otherwise combined in achieving such embodiments.

In one example, there is provided a device comprising:
a memory core, further comprising:
a plurality of memory partitions, each comprising:
a plurality of non-volatile memory (NVM) cross point arrays;
a partition control unit communicatively coupled to the plurality of NVM cross point arrays; and
a data buffer communicatively coupled to the plurality of NVM cross point arrays;
an uncore communicatively coupled to the memory core and configured to communicatively couple to a host;
a command address bus communicatively coupled to the uncore and to the partition control unit in each of the plurality of memory partitions; and
a data bus communicatively coupled to the uncore and to the data buffer in each of the plurality of memory partitions.

In one example of a device, the NVM cross point arrays are three dimensional cross point arrays.

In one example of a device, the memory core and the uncore are monolithically associated.

In one example of a device, each partition control unit further comprises at least one of a memory array driver, a sense amplifier, or a sequencer.

In one example of a device, the partition control units of the memory core regulate access to the NVM cross point arrays of the plurality of memory partitions.

In one example of a device, the partition control units further comprise circuitry to execute read access commands and write access commands on the NVM cross point arrays in the plurality of memory partitions according to one or more command and timing rules.

In one example of a device, the uncore is configured to receive memory access commands from the host, and to carry out the memory access commands across the plurality of memory partitions through the partition control units according to one or more rules defining timing for a given memory access type.

In one example of a device, the uncore is further configured to schedule multiple memory access commands across the plurality of memory partitions.

In one example of a device, scheduling multiple memory access commands further comprises:
scheduling memory access commands on partition control units of different memory partitions; and
providing memory access spacings to the partition control units.

In one example of a device, the multiple memory access commands are scheduled to the same memory partition, and scheduling multiple memory access commands further comprises providing a memory access spacing to the memory partition sufficient to allow a memory access to complete on the memory partition before a subsequent memory access is initiated.

In one example, a system is provided comprising:
a monolithic semiconductor substrate;
one or more semiconductor-on-chip (SOC) processors built on the substrate;
a memory core built on the substrate, further comprising:
a plurality of memory partitions, each comprising:
a plurality of non-volatile memory (NVM) cross point arrays;
a partition control unit communicatively coupled to the plurality of NVM cross point arrays; and
a data buffer communicatively coupled to the plurality of NVM cross point arrays;

an uncore built on the substrate and communicatively coupled to the memory core and to the one or more SoC processors;
a command address bus communicatively coupled to the uncore and to the partition control unit in each of the plurality of memory partitions; and
a data bus communicatively coupled to the uncore and to the data buffer in each of the plurality of memory partitions.

In one example of a system, the NVM cross point arrays are three dimensional cross point arrays.

In one example of a system, the one or more SoC processors are multi-core processors.

In one example of a system, each partition control unit further comprises at least one of a memory array driver, a sense amplifier, or a sequencer.

In one example of a system, the partition control units of the memory core regulate access to the NVM cross point arrays of the plurality of memory partitions.

In one example of a system, the partition control units further comprise circuitry to execute read access commands and write access commands on the NVM cross point arrays in the plurality of memory partitions according to one or more command and timing rules.

In one example of a system, the uncore is configured to receive memory access commands from the host, and to carry out the memory access commands across the plurality of memory partitions through the partition control units according to one or more rules defining timing for a given memory access type.

In one example of a system, the uncore is further configured to schedule multiple memory access commands across the plurality of memory partitions.

In one example of a system, scheduling multiple memory access commands further comprises:
scheduling memory access commands on partition control units of different memory partitions; and
providing memory access spacings to the partition control units.

In one example of a system, the multiple memory access commands are scheduled to the same memory partition, and scheduling multiple memory access commands further comprises: providing a memory access spacing to the memory partition sufficient to allow a memory access to complete on the memory partition before a subsequent memory access is initiated.

In one example, a computer-implemented method is provided comprising:
receiving a memory access command from a host at an uncore;
determining, in the uncore, a memory partition from a plurality of memory partitions on which to perform the memory access command;
determining, in the uncore, a memory access spacing from a command and timing rule for the memory access command based on memory access type and a memory access history of the memory partition;
scheduling, using the uncore, the memory access command on the memory partition at the memory access spacing, where the memory partition further comprises:
a plurality of non-volatile memory (NVM) cross point arrays;
a partition control unit communicatively coupled to the plurality of NVM cross point arrays; and
a data buffer communicatively coupled to the plurality of NVM cross point arrays.

In one example of a computer-implemented method, receiving the memory access command further comprises:
receiving a plurality of memory access commands at the uncore; and
scheduling, using the uncore, the memory access commands across the plurality of memory partitions, such that multiple memory partitions simultaneously process different memory access commands.

In one example of a computer-implemented method, the different memory access commands comprise both read access commands and write access commands.

In one example of a computer-implemented method, the memory access spacing is sufficient to allow the memory access to complete on the memory partition before any subsequent memory access is initiated.

It is noted that the disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A device, comprising:
a memory core, further comprising:
a plurality of memory partitions, each comprising:
a plurality of non-volatile memory (NVM) cross point arrays;
a partition control unit communicatively coupled to the plurality of NVM cross point arrays; and
a data buffer communicatively coupled to the plurality of NVM cross point arrays;
an uncore communicatively coupled to the memory core and configured to communicatively couple to a host;
a command address bus communicatively coupled to the uncore and to the partition control unit in each of the plurality of memory partitions; and
a data bus communicatively coupled to the uncore and to the data buffer in each of the plurality of memory partitions, wherein the uncore is further configured to:
receive multiple memory access commands from the host;
determine a memory access spacing for each memory access command according to one or more command and timing rules;
associate the determined memory access spacing with each memory access command; and
send the multiple memory access commands, each with the associated determined memory access spacing, to the partition control units of the plurality of memory partitions.

2. The device of claim 1, wherein the NVM cross point arrays are three-dimensional cross point arrays.

3. The device of claim 1, wherein the memory core and the uncore are monolithically associated.

4. The device of claim 1, wherein each partition control unit further comprises at least one of a memory array driver, a sense amplifier, or a sequencer.

5. The device of claim 1, wherein the partition control units of the memory core regulate access to the NVM cross point arrays of the plurality of memory partitions.

6. The device of claim 1, wherein the partition control units further comprise circuitry to execute read access commands and write access commands on the NVM cross point arrays in the plurality of memory partitions according to the one or more command and timing rules.

7. The device of claim 1, wherein the uncore is configured to carry out the memory access commands across the plurality of memory partitions through the partition control units according to one or more rules defining timing for a given memory access type.

8. The device of claim 1, wherein, for multiple memory access commands scheduled to a same memory partition, the associated determined memory access spacing to the same memory partition is sufficient to allow a memory access to complete on the same memory partition before a subsequent memory access is initiated.

9. A system, comprising:
a monolithic semiconductor substrate;
one or more semiconductor-on-chip (SOC) processors built on the substrate;
a memory core built on the substrate, further comprising:
 a plurality of memory partitions, each comprising:
  a plurality of non-volatile memory (NVM) cross point arrays;
  a partition control unit communicatively coupled to the plurality of NVM cross point arrays; and
  a data buffer communicatively coupled to the plurality of NVM cross point arrays;
an uncore built on the substrate and communicatively coupled to the memory core and to the one or more SoC processors;
a command address bus communicatively coupled to the uncore and to the partition control unit in each of the plurality of memory partitions; and
a data bus communicatively coupled to the uncore and to the data buffer in each of the plurality of memory partitions, wherein the uncore is further configured to:
 receive multiple memory access commands from the one or more SoC processors;
 determine a memory access spacing for each memory access command according to one or more command and timing rules;
 associate the determined memory access spacing with each memory access command; and
 send the multiple memory access commands, each with the associated determined memory access spacing, to the partition control units of the plurality of memory partitions.

10. The system of claim 9, wherein the NVM cross point arrays are three-dimensional cross point arrays.

11. The system of claim 9, wherein the one or more SoC processors are multi-core processors.

12. The system of claim 9, wherein each partition control unit further comprises at least one of a memory array driver, a sense amplifier, or a sequencer.

13. The system of claim 9, wherein the partition control units of the memory core regulate access to the NVM cross point arrays of the plurality of memory partitions.

14. The system of claim 9, wherein the partition control units further comprise circuitry to execute read access commands and write access commands on the NVM cross point arrays in the plurality of memory partitions according to the one or more command and timing rules.

15. The system of claim 9, wherein the uncore is configured to carry out the memory access commands across the plurality of memory partitions through the partition control units according to one or more rules defining timing for a given memory access type.

16. The system of claim 9, wherein, for multiple memory access commands scheduled to a same memory partition, the associated determined memory access spacing to the same memory partition is sufficient to allow a memory access to complete on the same memory partition before a subsequent memory access is initiated.

17. A computer-implemented method, comprising:
receiving multiple memory access commands from a host at an uncore;
determining, in the uncore, a memory partition from a plurality of memory partitions on which to perform each of the multiple memory access commands;
determining, in the uncore, a memory access spacing from a command and timing rule for each of the multiple memory access commands based on a memory access type and a memory access history of each determined memory partition;
scheduling, using the uncore over a command address bus, each of the multiple memory access commands on each determined memory partition at the determined memory access spacing such that the plurality of memory partitions simultaneously process different memory access commands, where each of the plurality of memory partitions further comprises:
 a plurality of non-volatile memory (NVM) cross point arrays;
 a partition control unit communicatively coupled to the plurality of NVM cross point arrays; and
 a data buffer communicatively coupled to the plurality of NVM cross point arrays.

18. The method of claim 17, wherein the multiple memory access commands comprise both read access commands and write access commands.

19. The method of claim 18, wherein the determined memory access spacing to a same determined memory partition is sufficient to allow a memory access to complete on the same determined memory partition before any subsequent memory access is initiated.

* * * * *